United States Patent
Prabhu

(10) Patent No.: US 6,291,982 B1
(45) Date of Patent: Sep. 18, 2001

(54) TRUE AVERAGE WIDE DYNAMIC RANGE POWER SENSOR

(75) Inventor: Ajay A. Prabhu, Rohnert Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/289,428

(22) Filed: Apr. 9, 1999

(51) Int. Cl.[7] ................................................. G01R 27/02
(52) U.S. Cl. ........................................................... 324/95
(58) Field of Search ............................... 324/95, 637, 638, 324/615, 616

(56) References Cited

U.S. PATENT DOCUMENTS

| | | | |
|---|---|---|---|
| 4,873,484 | * 10/1989 | Adam | 324/95 |
| 4,943,764 | 7/1990 | Szente et al. | 324/95 |
| 5,204,613 | 4/1993 | Cripps et al. | 324/95 |
| 5,656,929 | * 8/1997 | Humpherys | 324/95 |

* cited by examiner

Primary Examiner—Safet Metjahic
Assistant Examiner—J Kerveros

(57) ABSTRACT

The present invention provides a true average wide dynamic range (TA-WDR) power sensor that can be used to make accurate power measurements from −70 dBm to +20 dBm or more (wide dynamic range), regardless of the format of the signal (true average). In one preferred embodiment, the present invention provides a true average wide dynamic range power sensor comprising an input for receiving RF signals having wide dynamic power ranges, a first RF path including a low power diode sensor for measuring RF signals having low power ranges, a second RF path including an attenuator high power sensor for measuring RF signals having high power ranges, and a switch for isolating the first RF path when the high power RF signals exceeds the square law region of the diode sensor.

13 Claims, 4 Drawing Sheets

TRUE AVERAGE WIDE DYNAMIC RANGE POWER SENSOR

BACKGROUND OF THE INVENTION

The present invention relates to a true average wide dynamic range power sensor (TA-WDR) that can be used to make accurate power measurements from −70 dBm to +20 dBm or more (wide dynamic range), regardless of the format of the signal (true average). True average sensors have been in use for many decades in the −70 dBm to −20 dBm (based on diode operating in its "square-law" region), and −30 dBm to +20 dBm (based on thermocouple, or thermistor, or diode sensor with an attenuator at its input) separately. There is not a single sensor that covers the entire dynamic range stated above.

Recently, diode based wide dynamic range sensors have been introduced that cover the entire −70 dBm to +20 dBm range by pushing a diode sensor way beyond its limit (−20 dBm) for measuring the power. Because the diode is beyond its limit for true average power measurement in the −20 dBm to +20 dBm, these sensors can only be used for measuring power accurately of a single-frequency (continuous wave signal or CW signal). Most applications require measurement of complex signals with many frequency components in it (immense demand for such sensors is due to the fast growing digital communications market).

SUMMARY OF THE INVENTION

It is an object of the present invention to provide a true average wide dynamic range power sensor (TA-WDR) that can be used to make accurate power measurements from −70 dBm to +20 dBm or more (wide dynamic range), regardless of the format of the signal (true average).

In one preferred embodiment, the present invention provides a true average wide dynamic range power sensor comprising means for receiving RF signals having wide dynamic power ranges; a first RF path including a low power diode sensor for measuring RF signals having low power ranges; a second RF path including a high power sensor for measuring RF signals having high power ranges; and means for isolating the first RF path when the high power RF signals exceeds the square law region of the diode sensor.

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification and in which like numerals represent like components, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

The present invention provides a true average wide dynamic range power sensor that is capable of making very accurate true average wide dynamic range power measurements.

Figure 1:
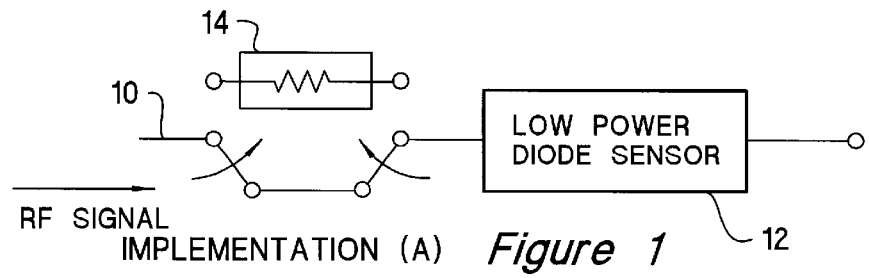
FIG. 1 shows one implementation of a true average wide dynamic range power sensor.

While there are several techniques for designing true average wide dynamic range power sensors, all these ideas consist of using a diode for measuring low power signal (−70 dBm to −20 dBm). It is important to realize that the ability to make a measurement of the lowest power signal is a limiting factor. Since a higher power signal can always be attenuated (by a known factor) easily to bring it down to a level that can be measured by a low power sensor. However, there is no simple technique to measure signals below −70 dBm (below which the diodes become too noisy). Thus in various possible implementations of a true average wide dynamic range sensor, a diode sensor is used to measure low power signals. To measure higher-power signals, an attenuator could be switched-in in the RF signal path of the same diode sensor, as shown in FIG. 1, which shows the RF signal on the RF signal path 10 input to low power diode sensor 12. The diode sensor 12 receives low power RF signals and the switched attenuator 14 effectively removes high power RF signals by reducing such signals to the region of the square law.

Figure 2:
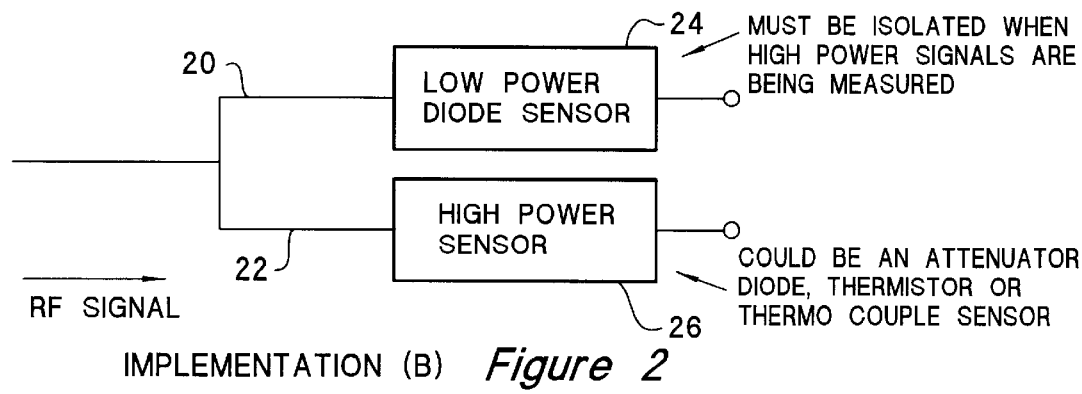
FIG. 2 shows another implementation of a wide dynamic range power sensor.

In another implementation, shown in FIG. 2, the incoming signal is directed into two separate paths 20, 22, one RF path 20 going to a diode 24 which receives the RF signals for low power measurement and the other RF path 22 going to a high power sensor 26, which could be a thermistor, thermocouple, or an attenuated diode sensor (called, in general, a "high power sensor") which receives the RF signals to measure the high power signal.

In this second implementation of a true average wide dynamic range sensor, it has been determined that the presence of the low power diode sensor has very detrimental effects when a high power signal is input into this circuit and the high power arm of this circuit attempts to make an accurate measurement.

Figure 3:
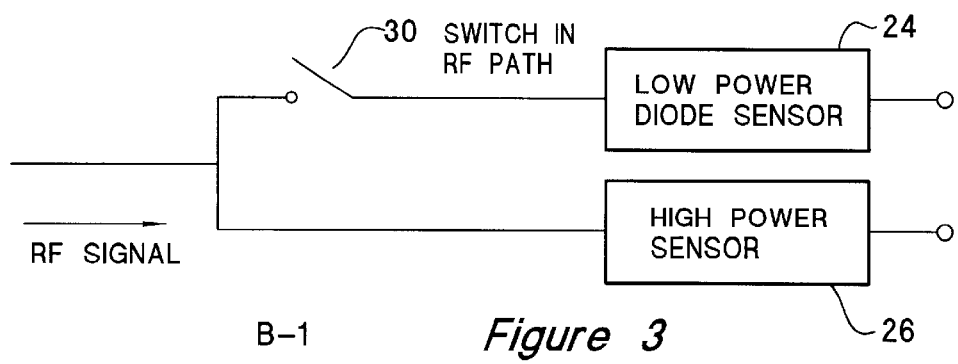
FIG. 3 shows a wide dynamic range power sensor with a switch in the RF path.

Thus, one must electrically isolate the effects of low power diode sensor from the circuit when the signal level goes beyond its square law region. This can be done using a switch 30 of some type (electronic, mechanical, micro-mechanical) in the RF signal path to isolate the low power diode sensor, as shown in FIG. 3.

Figure 4:
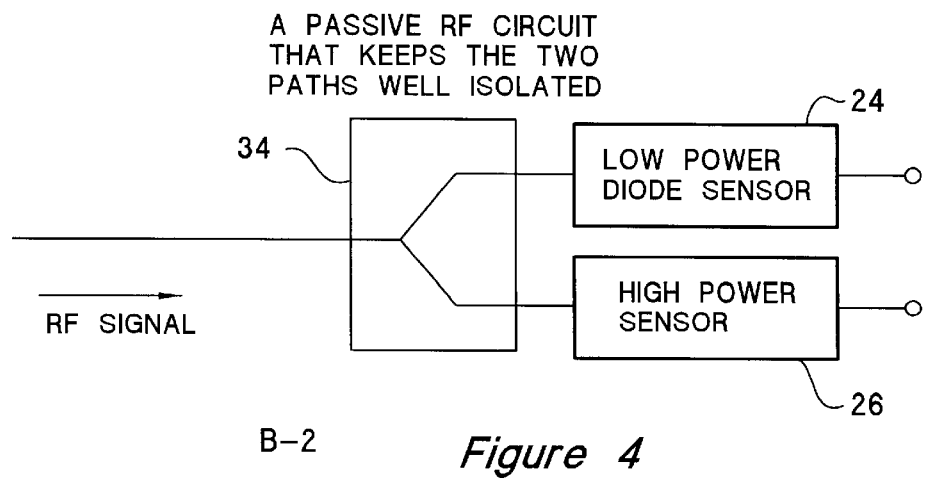
FIG. 4 shows a wide dynamic range power sensor with a passive RF circuit.

This could also be accomplished using a passive circuit 34 shown in FIG. 4 that provides high isolation between the high power sensor and the low power diode sensor (for example using a high isolation splitter circuit, or a high isolation directional coupler etc.). The switches and the passive circuits mentioned above are in the RF signal path and thus must be designed with utmost care. Due to the very nature of these circuits, they will introduce frequency bandwidth limitations (at least with switches available at this time).

Figure 5:
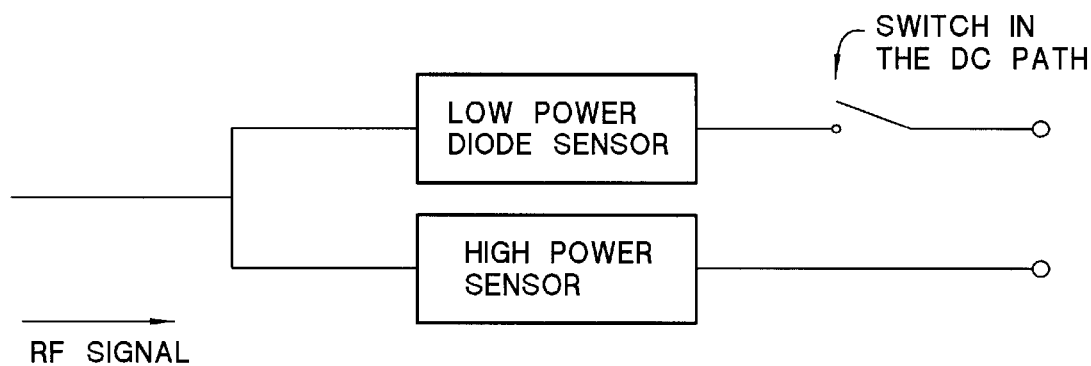
FIG. 5 shows a wide dynamic range power sensor with a switch in the DC path.

The proper functioning of the high power sensor can be affected due to the excessive DC current flowing through the low power path diode when, inevitably, its input terminal encounters high power RF signal, which is truly meant to be measured by the high power sensor. Most of the benefits of isolating the low power diode sensor from the RF signal path can be achieved simply by disconnecting the DC path of the diode, thus preventing any DC current flow through the diode. This arrangement is shown in FIG. 5, which shows the switch 38 in the DC path 40.

Unlike disconnecting or isolating the RF path, it is very simple to disconnect the DC circuit using readily available switches (this could be any convenient switch that does not deteriorate the performance of the diode sensor when it is in fact being used for making low power measurements).

Diodes are extensively used in all kinds of electronic circuits. The non-linear current versus voltage characteristics (I-V characteristics) of diodes are exploited in several circuits to perform useful tasks. The non-linear I-V characteristic results in varying diode impedance as the current through the diode varies. In microwave circuits, matching the impedance of a circuit to the impedance of a source is of prime importance to achieve efficient signal transfer with low levels of signal reflections. In many cases, the varying diode impedance is an inevitable fact that the design should try to compensate for. In other applications where the diode is not actively used, much of the detrimental effects of diode impedance variation can be eliminated simply by disconnecting the DC path of the diode from the circuit using either a mechanical or an electronic switch. This technique has been demonstrated in the true average wide dynamic range power sensor and has resulted in significant improvements in the accuracy and performance of this instrument.

The influence of DC current on diode impedance will now be described. The relationship between voltage and current in a diode is $$I(V) = I_s(e^{aV} - 1)$$

where I is the current through the diode when voltage, V, is applied across it. $I_s$ is the saturation current, which is a constant at any given temperature. In general, if V consists of a DC component, $V_o$, and an AC component, v, as follows $$V = V_o + v$$

The diode impedance, commonly known as video resistance, Rv, is $$R_v = \left[\frac{dI}{dV}\bigg|_{V_o}\right]^{-1} = \frac{1}{\alpha(I_o + I_s)}$$

where $I_o$ is the bias current due to DC voltage, $V_o$.

Thus, Rv, is inversely proportional to $I_o + I_s$. At zero bias ($I_o = 0$), $R_v$ is $$R_v = \left[\frac{dI}{dV}\bigg|_{V_o}\right]^{-1} = \frac{1}{\alpha I_s}$$

Figure 6:
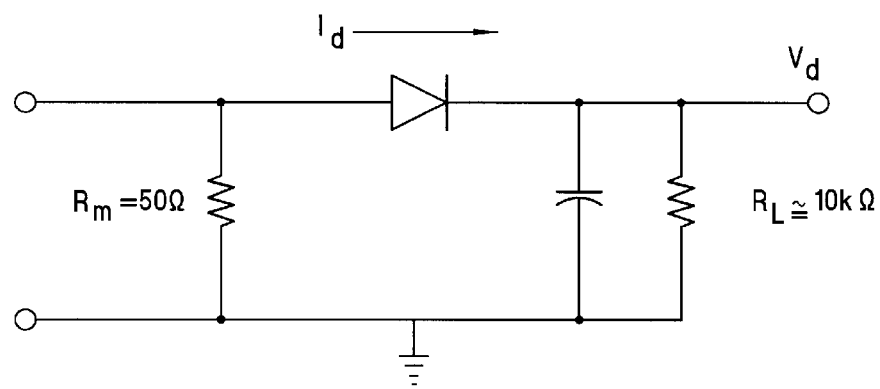
FIG. 6 shows a schematic diagram of a diode detector circuit.

RF power detection and power measurement is one of the most important applications of diodes in microwave circuits. A schematic of a detector circuit is shown in FIG. 6. In this circuit, the RF voltage is applied across the parallel combination of a matching resistor, $R_m$, and the diode D. For small RF signals, a rectified DC voltage proportional to the square of the RF voltage appears at the output terminal. Under these conditions, the diode is said to be in its square-law region of operation. The capacitor $C_b$ shorts the RF signal at the diode output, ensuring all of the RF voltage appears across the diode D. In addition, being a dc-block, it allows the detected voltage, $V_d$, to be tapped at the output terminal. The load resistor, $R_L$, acts as a discharge path for the voltage built-up across the capacitor. For a given $V_d$, the load resistor causes a DC current equal to $V_d/R_L$, which must flow through the diode D as well.

From the circuit diagram, it is clear that the RF matching impedance of the detector is equal to the parallel combination of $R_v$ and $R_m$. To maintain good match, it is required that the diode resistance remain high compared to $R_m$. However, $R_v$ can not be too high as it decreases the diode sensitivity. A compromise between good low-power sensitivity and match requires $R_v$ to be in the 1 to 2 kilo-ohms range. The match remains good when the diode D is in its square-law region, where the detected voltage is small and the DC current through the load resistor (typically 10 kilo-ohms) is very small.

Until recently, diode detectors in power sensors have always been used with the diode in its square-law region. Thus, the changing value of $R_v$ has not been an issue. At higher input power levels, where the detected voltage is higher, the DC current through the diode can be so high that the diode resistance may become too small to maintain a good match. In recent power sensors, a diode has been used to measure RF signals up to 100 mW using essentially the same detector circuit as shown above. However, in the region beyond 10 micro-watts, where the diode detector is no longer in its square-law region, only a continuous wave signal can be measured accurately. This is a major drawback for these sensors, as many applications, especially digital communications, require accurate measurement of non-CW signals.

Figure 7:
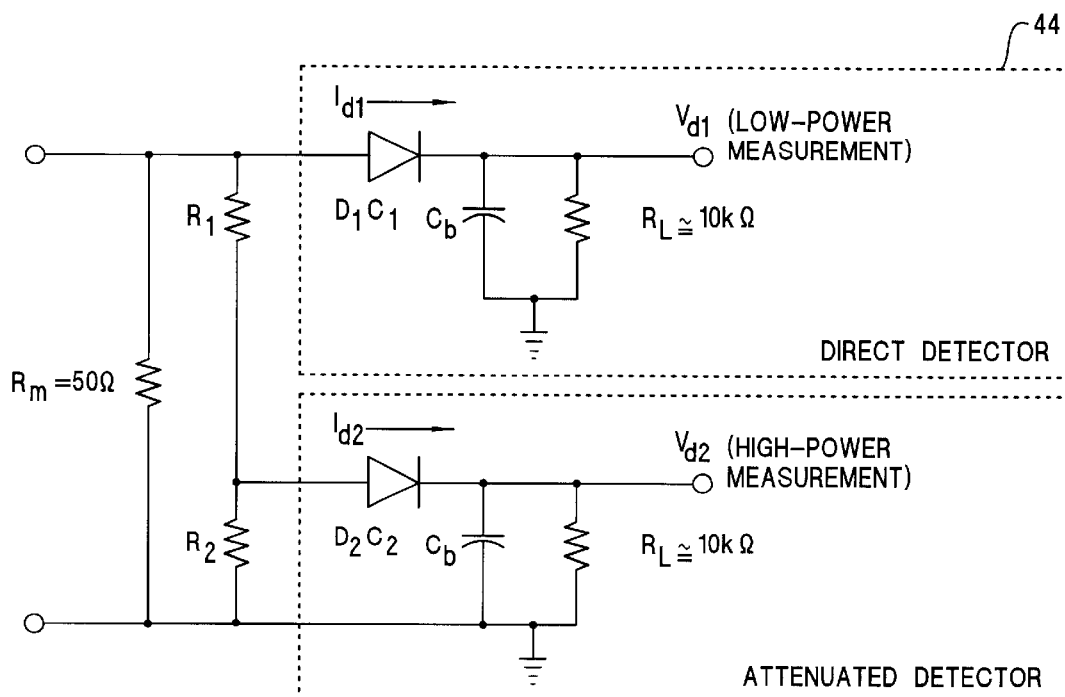
FIG. 7 shows a schematic diagram of a diode-attenuator-diode circuit.

In the present invention, two separate detector circuits have been integrated on the same GaAs chip. One of the detectors 44 measures the signal directly from the source. The other detector 48 is presented with a sample of the signal that is highly attenuated using an on-chip resistive divider network, including R1, R2. The detected voltages from the direct and the attenuated detectors are used to measure low power and high power signals, respectively. The schematic is shown in FIG. 7.

Both detectors 44, 48 measure RF power when the diodes are in square-law region. However, when the detectors are used for measuring high power signals, the diode D1 in the direct detector 44 encounters very high RF voltages across its terminals. Thus, the detected voltage in the direct detector 44 is high. This causes a high bias current to flow through this diode D1 causing its impedance to drop and thus changing the RF voltage across the high power sensor 48. This change in impedance match causes an apparent non-linearity in the detected voltage at the attenuator detector 48, thus affecting the purpose of this new design.

Figure 8:
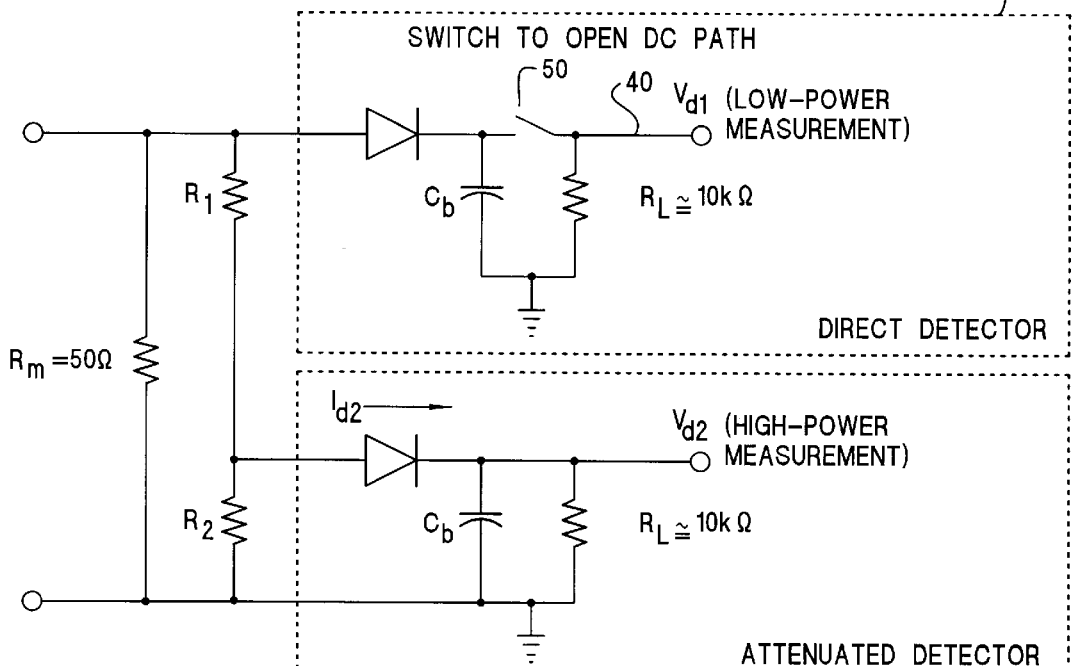
FIG. 8 shows a schematic diagram showing the switch in the DC path.

The present invention solves this problem. The root cause of the problem is the DC current flowing through the diode D1 in the direct detector 44 when its detection is no longer in use. Thus, its high impedance can be maintained by open circuiting its DC current path. In one embodiment, the design has been implemented with FET (field effect transistor) switch that open circuits the DC path in the direct detector, as soon as the attenuated detector voltage is used to measure high power signals. This arrangement is shown in FIG. 8 showing the switch 50 in the DC path 40. Now there is no DC current flowing through the low power diode D1. A mechanical switch could also have been used instead of a FET switch. However, FET switches are more repeatable, and last much longer.

Figure 9:
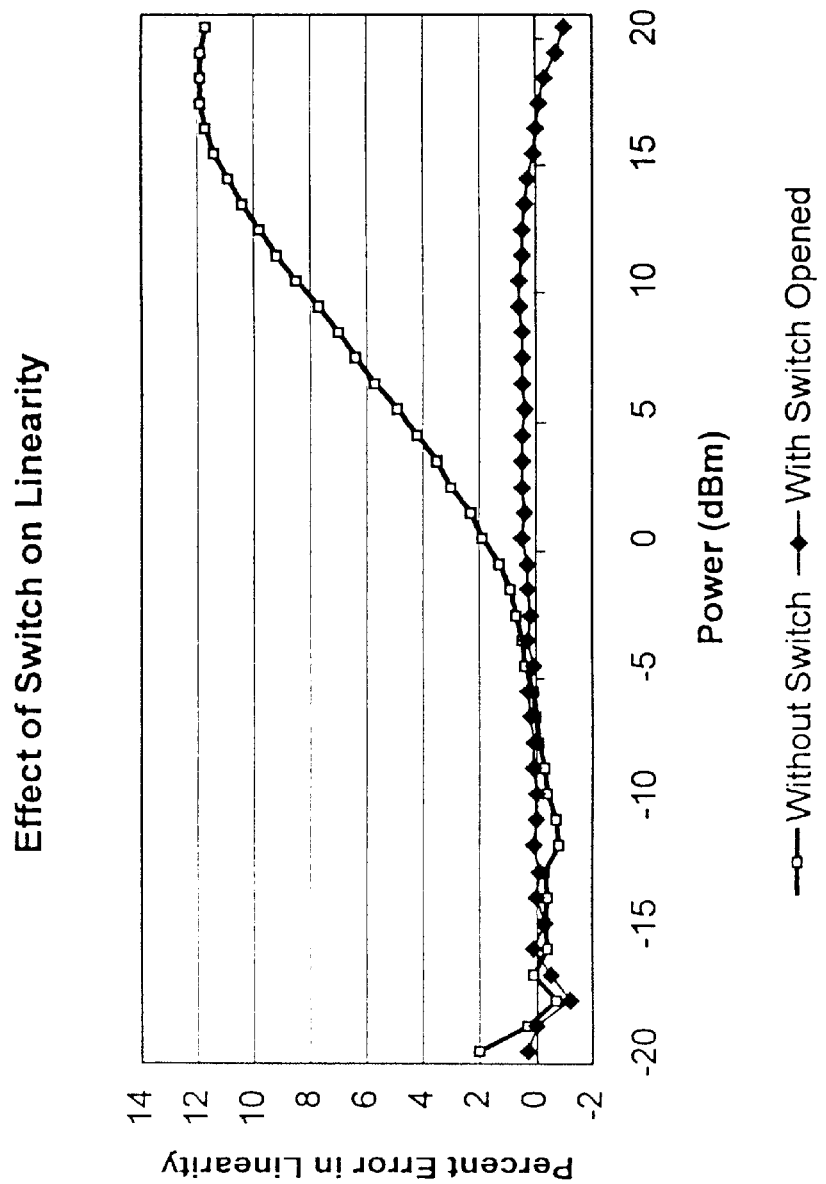
FIG. 9 shows the effect of the switch of FIG. 8 on linearity.

This technique has significantly improved the dynamic range, accuracy, impedance match and frequency response of the power sensor according to the present invention. The most important performance parameter, the linearity of the detector, with and without the use of this technique, is shown in FIG. 9 so as to highlight the benefit of this technique. FIG. 9 shows that the error in linearity when the switch is not used is very high. The residual error in linearity when the switch is used is due to the attenuated detector 48 itself. Thus, the great majority of the detrimental effects of low power diode sensor have been eliminated by open circuiting the DC path in that circuit. In FIG. 9, error in linearity is very high when the low power diode conducts DC current. With the switch open, circuiting the DC path and preventing DC current flow through the low power diode sensor, the high power measurement accuracy remains intact.

Although not depicted, the embodiment of the invention wherein a plurality of sensor paths are provided (in addition to low and high, for instance, medium, or perhaps, extra high) are included within the scope of the claims.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A wide dynamic range power sensor comprising:
   a) a low power detector for measuring RF signals having low power ranges; wherein the low power detector has a DC path;
   b) a high power detector for measuring RF signals having high power ranges; wherein the sensor employs one of the low power detector and the high power detector for making measurements;
      wherein the low power detector includes a switch that opens the DC path when the sensor uses the high power detector for measurement and that closes the DC path when the sensor uses the low power detector for measurement.

2. The wide dynamic range power sensor as in claim 1 wherein the wide dynamic range power range is from −70 dBm to +20 dBm or more.

3. The wide dynamic range power sensor as in claim 1 including attenuation means for attenuating the high power RF signals.

4. The wide dynamic range power sensor as in claim 1 wherein the switch in the DC path includes one of a mechanical switch, a field effect transistor (FET) switch, and any switch that when opened prevent the flow of DC current through the diode sensor and when closed does not prevent the flow of DC current through the diode sensor.

5. The wide dynamic range power sensor as in claim 1 wherein the second detector circuit includes an attenuator-diode sensor.

6. The wide dynamic range power sensor as in claim 1 wherein the second detector circuit includes a thermistor sensor.

7. The wide dynamic range power sensor as in claim 1 wherein the second detector circuit includes a thermocouple sensor.

8. The wide dynamic range power sensor as in claim 1 wherein the attenuation means includes a resistive divider network for attenuating the high power RF signals in the second RF path.

9. The wide dynamic range power sensor as in claim 1 wherein the first detector circuit and the second detector circuit are integrated on a single GaAs integrated circuit.

10. The wide dynamic range power sensor as in claim 1 wherein the first detector circuit includes a low power diode sensor and the second detector circuit includes a high power sensor.

11. A wide dynamic range power sensor comprising:
   a) means for receiving RF signals having wide dynamic power ranges; b) a first RF path including a low power diode sensor for measuring RF signals having low power ranges and a DC circuit; and
   c) a second RF path including a high power sensor for measuring RF signals having high power ranges; and
   d) means for isolating the DC circuit when the low power diode sensor is employed for measuring RF signals and for connecting the DC circuit when the high power diode sensor is employed for measuring RF signals.

12. The wide dynamic range power sensor as in claim 11 wherein means for isolating the DC circuit when the low power diode sensor is employed for measuring RF signals and for connecting the DC circuit when the high power diode sensor is employed for measuring RP signals includes
   means for isolating the DC circuit when the high power RF signals exceed the square law region of the low power diode sensor.

13. A wide dynamic range power sensor comprising:
   a) a low power sensor coupled to an RF signal path for measuring RF signals having low power ranges; wherein the low power sensor has a DC path that is separate from the RF signal path;
   b) a high power sensor coupled to the RF signal path for measuring RF signals having high power ranges; wherein the sensor employs one of the low power sensor and the high power sensor for making measurements;
      wherein the low power sensor includes a switch that is disposed in the DC path for opening the DC path when the sensor uses the high power sensor for measurement and for closing the DC path when the sensor uses the low power sensor for measurement; and
      wherein the switch reduces the detrimental effects of the low power sensor on high power measurements when open.

* * * * *